(12) United States Patent  
Limberg

(10) Patent No.: US 8,179,982 B2  
(45) Date of Patent: May 15, 2012

(54) TRANSMITTING ADDITIONAL INFORMATION IN THE HEADERS OF ENCAPSULATING DATA PACKETS IN MOBILE/HANDHELD (M/H) DTV SIGNALS

(75) Inventor: Allen LeRoy Limberg, Port Charlotte, FL (US)

(73) Assignee: Samsung Electronics Co., Ltd., Suwon-si (KR)

( * ) Notice: Subject to any disclaimer, the term of this patent is extended or adjusted under 35 U.S.C. 154(b) by 429 days.

(21) Appl. No.: 12/427,909

(22) Filed: Apr. 22, 2009

(65) Prior Publication Data

US 2009/0262799 A1  Oct. 22, 2009

Related U.S. Application Data

(60) Provisional application No. 61/125,047, filed on Apr. 22, 2008, provisional application No. 61/131,870, filed on Jun. 14, 2008.

(51) Int. Cl.  
*H04L 5/12* (2006.01)  
*H04L 1/00* (2006.01)

(52) U.S. Cl. .................... 375/240.27; 375/265

(58) Field of Classification Search .................. None  
See application file for complete search history.

(56) References Cited

U.S. PATENT DOCUMENTS 6,081,650 A * 6/2000 Lyons et al. ............... 386/240  
7,376,159 B1 * 5/2008 Stanger et al. ............ 370/528  
2002/0051445 A1 * 5/2002 Drottar et al. ............. 370/362  
2002/0181581 A1 * 12/2002 Birru et al. ............. 375/240.01  
2003/0007103 A1 * 1/2003 Roy ........................... 348/731  
2003/0012290 A1 * 1/2003 Fimoff et al. ............. 375/265  
2004/0090997 A1 * 5/2004 Choi et al. ................. 370/535

OTHER PUBLICATIONS

KBS BTRI (Broadcast Technical Research Institute), "KBS Broadcast Technical Research 2007—a DTV Transmission Technical Trend", 2007, pp. 73-92.  
A/53: ATSC Digial Television Standard, Parts 1-6, Jan. 3, 2007.  
Wayne Luplow (Zenith Electronics), In-Band Mobile, Pedestrian, and Handheld Service for the ATSC Broadcaster, Nov. 26, 2007, pp. 1-39.  
DM R & D Center (Samsung Electronics), "Advanced VSB" Apr. 18, 2007, pp. 1-8.

* cited by examiner

*Primary Examiner* — Thai Tran  
*Assistant Examiner* — Sunghyoun Park  
(74) *Attorney, Agent, or Firm* — Sughrue Mion, PLLC

(57) ABSTRACT

Apparatus for transmitting digital data in an 8-vestigial sideband (8-VSB) signal format for reception by mobile/handheld (M/H) receivers is described. The apparatus for transmitting digital data includes a generator of MHE packet headers that include additional information about at least part of the digital data and a packet formatter that installs the MHE packet headers in the MHE packets. Apparatus for receiving the digital data and recovering the additional information from the MHE packet headers to be used for modifying operation of the receiving apparatus is also described.

21 Claims, 5 Drawing Sheets

| PID OF ENCAPSULATING DATA PACKET | VERSIONS OF M/H STANDARD THAT DATA ARE USED IN |
|---|---|
| α | 1.0 |
| β | 1.0 ONLY |
| χ | 1.0 & 2.0 ONLY |
| δ | 1.0 & 3.0 ONLY |
| ε | 1.0 & 4.0 ONLY |
| ϕ | 2.0 |
| γ | 2.0 ONLY |
| η | 4.0 |
| ι | 1.0, 2.0, 3.0 & 4.0 |
| φ | 2.0, 3.0 & 4.0 |
| κ | 1.0, 3.0 & 4.0 |
| λ | 1.0, 2.0 & 4.0 |
| μ | 3.0 & 4.0 |
| ν | 2.0 & 4.0 |
| ο | 1.0 & 4.0 |
| π | 5.0 |
| θ | 2.0, 3.0, 4.0 & 5.0 |
| ρ | 3.0, 4.0 & 5.0 |
| σ | 2.0, 4.0 & 5.0 |
| τ | 2.0, 3.0 & 5.0 |
| υ | 4.0 & 5.0 |
| ϖ | 3.0 & 5.0 |
| ω | 2.0 & 5.0 |
| ξ | 6.0 |
| ψ | 4.0, 5.0 & 6.0 |
| ζ | 5.0 & 6.0 |

Fig. 2

| PID IDENTIFIER | CODE RATE REDUCTION W/R TO A/53 8-VSB | AVC | SVC | VERSION OF M/H STANDARD |
|---|---|---|---|---|
| α | 8:1 PCCC | N/A | N/A | 1.0 |
| β | 2:1 | 1.3 | NONE | 1.0 |
| χ | 3:1 | 1.3 | NONE | 1.0 |
| δ | 4:1 | 1.3 | NONE | 1.0 |
| ε | 2:1 | N/A | 1.3 TO 2.0 | 2.0 |
| φ | 3:1 | N/A | 1.3 TO 2.0 | 2.0 |
| γ | 4:1 | N/A | 1.3 TO 2.0 | 2.0 |
| η | 2:1 | 2.0 | NONE | 2.0 |
| ι | 3:1 | 2.0 | NONE | 2.0 |
| φ | 4:1 | 2.0 | NONE | 3.0 |
| κ | 2:1 | N/A | 2.0 TO 3.0 | 3.0 |
| λ | 3:1 | N/A | 2.0 TO 3.0 | 3.0 |
| μ | 4:1 | N/A | 2.0 TO 3.0 | 4.0 |
| ν | 2:1 | N/A | 1.3 TO 3.0 | 5.0 |
| ο | 3:1 | N/A | 1.3 TO 3.0 | 5.0 |
| π | 4:1 | N/A | 1.3 TO 3.0 | 5.0 |
| θ | 2:1 | 3.0 | NONE | 5.0 |
| ρ | 3:1 | 3.0 | NONE | 6.0 |
| σ | 4:1 | 3.0 | NONE | 7.0 |
| τ | 2:1 | N/A | 3.0 TO 4.0 | 7.0 |
| υ | 3:1 | N/A | 3.0 TO 4.0 | 7.0 |
| ϖ | 2:1 | N/A | 2.0 TO 4.0 | 8.0 |
| ω | 2:1 (REPEAT) | 2.0 | NONE | 2.0 |
| ξ | 2:1 (REPEAT) | N/A | 2.0 TO 3.0 | 3.0 |
| ψ | 2:1 (REPEAT) | 3.0 | NONE | 5.0 |
| ζ | 2:1 (REPEAT) | N/A | 3.0 TO 4.0 | 7.0 |

Fig. 5

TRANSMITTING ADDITIONAL INFORMATION IN THE HEADERS OF ENCAPSULATING DATA PACKETS IN MOBILE/HANDHELD (M/H) DTV SIGNALS

CROSS-REFERENCE TO RELATED APPLICATIONS

This application claims priority from U.S. Provisional Patent Applications Nos. 61/125,047 filed on 22 Apr. 2008, and 61/131,870 filed on 14 Jun. 2008, the entire contents of each of which applications are incorporated herein by reference

SUMMARY

Apparatuses and methods consistent with the present invention relate to digital television (DTV) signals for over-the-air broadcasting, transmitters for the broadcast DTV signals, and receivers for the broadcast DTV signals.

The Advanced Television Systems Committee (ATSC) published a Digital Television Standard in 1995 as Document A/53, hereinafter referred to simply as "A/53" for the sake of brevity. Annex D of A/53 titled "RF/Transmission Systems Characteristics" is particularly incorporated by reference into this specification. In the beginning years of the twenty-first century, efforts have been made to provide for more robust transmission of data over broadcast DTV channels without unduly disrupting the operation of so-called "legacy" DTV receivers already in the field. Robust transmission of data for reception by mobile and handheld receivers will be provided for in successive versions of an ATSC Standard for DTV Broadcasting to Mobile and Handheld Receivers referred to more briefly as the "M/H Standard". The initial version of this standard is referred to as M/H 1.0; a subsequent version is referred to as M/H 2.0; etc.

The operation of nearly all legacy DTV receivers is disrupted if ⅔ trellis coding is not preserved throughout every transmitted data field. Also, the average modulus of a DTV signal should be the same as for the 8-vestigial sideband (8-VSB) signal as specified in the 1995 version of A/53, so as not to disrupt adaptive equalization in legacy receivers using the constant modulus algorithm (CMA).

Another problem concerning legacy DTV receivers is that a large number of such receivers were sold that were designed not to respond to broadcast DTV signals unless de-interleaved data fields recovered by trellis decoding were preponderantly filled with (207, 187) Reed-Solomon forward-error-correction (R-S FEC) codewords of a specific type or correctable approximations to such codewords. Accordingly, in order to accommodate continuing DTV reception by such legacy receivers, robust transmissions are constrained in the following way. Before convolutional byte interleaving, data fields should be preponderantly filled with (207, 187) R-S FEC codewords of the type specified in A/53.

This constraint has led to the M/H data encoded for reception by mobile and handheld DTV receivers being encapsulated within (207, 187) R-S FEC codewords of the general type specified in A/53, differing in that they are not necessarily systematic with the twenty parity bytes located at the conclusions of the codewords. The twenty parity bytes of some (207, 187) R-S FEC codewords appear earlier in the codewords to accommodate the inclusion of training signals in the fields of interleaved data. The 207-byte R-S FEC codewords invariably begin with a three-byte header similar to the second through fourth bytes of an MPEG-2 packet, with a thirteen-bit packet identification code or packet identifier (PID) in the fourth through sixteenth bit positions. Except for the three-byte header and the twenty parity bytes in each (207, 187) R-S FEC codeword, the remainder of the codeword is available for "encapsulating" 184 bytes of a robust transmission.

A standard for DTV broadcasting using serially concatenated convolutional coding (SCCC) for robust transmission was scheduled for completion by February 2009. The SCCC includes outer convolutional coding, which is symbol-interleaved before being supplied for inner convolutional coding corresponding to the ⅔ trellis coding specified by A/53. The bytes of the symbol-interleaved outer convolutional coding are encapsulated in (207, 187) R-S FEC codewords. The standard scheduled for completion by February 2009 also provides for the transmission of data in tabular form for updating a respective electronic service guide (ESG) in each receiver. Broadcasters want the ESG in each receiver to be operable to supply information concerning broadcast services available to that particular receiver, but to withhold information concerning broadcast services that are unavailable to that particular receiver. There is a high likelihood that the DTV broadcasting standard will continue to be updated from time to time. Broadcasters have indicated that they wish to signal receivers which portions of DTV broadcast signals will be successfully received only by receivers designed to receive DTV signals broadcast in accordance with updates in the DTV broadcasting standard.

Considerable time has been spent by engineers from several companies in trying to discern a system for satisfying the broadcasters' desires. Much of the thought has tried to build on the already-in-place practice of signaling different types of transmission using the eight 8-VSB symbols just before the final twelve 8-VSB symbols of the data-field synchronization (DFS) segments. Each of these eight 8-VSB symbols can be used for signaling which respective one of various versions of the DTV Broadcast Standard is used for making DTV transmissions.

Engineers of Coherent Logix, Inc. proposed schemes for controlling operations in the earlier stages of DTV receivers responsive to signals taken from their later stages of reception or responsive to signals received in parallel with M/H signals. These proposals used decision trees that branched outward as operations of successively earlier stages of a receiver were considered. This seemed to the inventor to be contrary to what would actually be required in practice. The inventor perceived that it was preferable to begin decision trees initially considering the earliest stages of reception and branching outward as operations of successively later stages of a receiver were considered. In part, this preference was based on the fact that changes in standard were more likely to impact later stages of receivers. The branching of the decision tree better mapped the possibilities of various receiver designs for different transmission modes. This preferred construction of the decision tree facilitates better control of power consumption by the later stages of a receiver capable of receiving broadcasts made in accordance with later versions of the M/H Standard. Later stages that were unnecessary for receiving broadcasts made in accordance with earlier versions of the M/H Standard could be de-activated to save power. So could earlier stages that were unnecessary for receiving broadcasts made in accordance with later versions of the M/H Standard. Furthermore, the practice of placing the instructions for disposition of a packet in its header simplifies insuring that the instructions are timely received, since the packet and the instructions therein are subject to similar delays in the receiver.

The present invention provides using PIDs for the (207, 187) R-S FEC codewords to encapsulate robust transmissions. These PIDs have been described as those designated for null MPEG-2 packets. Legacy DTV receivers ignore null MPEG-2 packets in a transport stream, and also ignore any other packets that have PIDs that packet selectors in the receivers do not recognize. Null packets are used in DTV transmitters for purposes other than those associated with robust data transmission. The ATSC may assign a different PID or PIDs for packets that encapsulate robust transmissions and for the (207, 187) R-S FEC codewords derived from those packets. The packets that encapsulate transmissions of redundantly coded M/H service data and have these special PIDs are referred to as "MHE packets" in this specification.

According to an aspect of the present invention, PIDs assigned by ATSC for use in the headers of (207, 187) R-S FEC codewords used to encapsulate robust transmissions should be different for each new version of the ATSC DTV Broadcast Standard. These PIDs are used by receivers for each successive generation of the M/H Standard to control the flow of signals to the later stages of reception. Only those M/H packets that can be usefully received by the receiver are passed from the earlier stages of the receiver to its later stages, this determination being made from the PIDs in the headers of (207, 187) R-S FEC codewords used to encapsulate the M/H data.

The tabular data for the electronic service guides (ESGs) of receivers are encapsulated within (207, 187) R-S FEC codewords with the PIDs for the M/H version that can successfully receive the described program. The ESG of a receiver is written only by the ESG encoded within the (207, 187) R-S FEC codewords with the PID for the most recent M/H version that the receiver can usefully receive.

BRIEF DESCRIPTION OF THE DRAWING

FIG. 2 is a table illustrating how the PIDs in the headers of (207, 187) R-S FEC codewords used to encapsulate the M/H service data can signal versions of the M/H Standard in accordance with which those M/H service data are transmitted, according to an exemplary embodiment.

FIG. 5 is a table illustrating how the PIDs in the headers of (207, 187) R-S FEC codewords used to encapsulate the M/H service data can signal more than just the versions of the M/H Standard in accordance with which those M/H service data are transmitted, according to an exemplary embodiment.

DETAILED DESCRIPTION

The M/H system provides M/H broadcasting services using a portion of the 19.39 Mbps ATSC 8-VSB transmission, while the remainder is still available for high-definition or multiple standard-definition television services. The M/H system is a dual-stream system comprising an ATSC main service multiplex for existing digital television services and an M/H service multiplex for one or more mobile and hand-held services.

Figure 1:
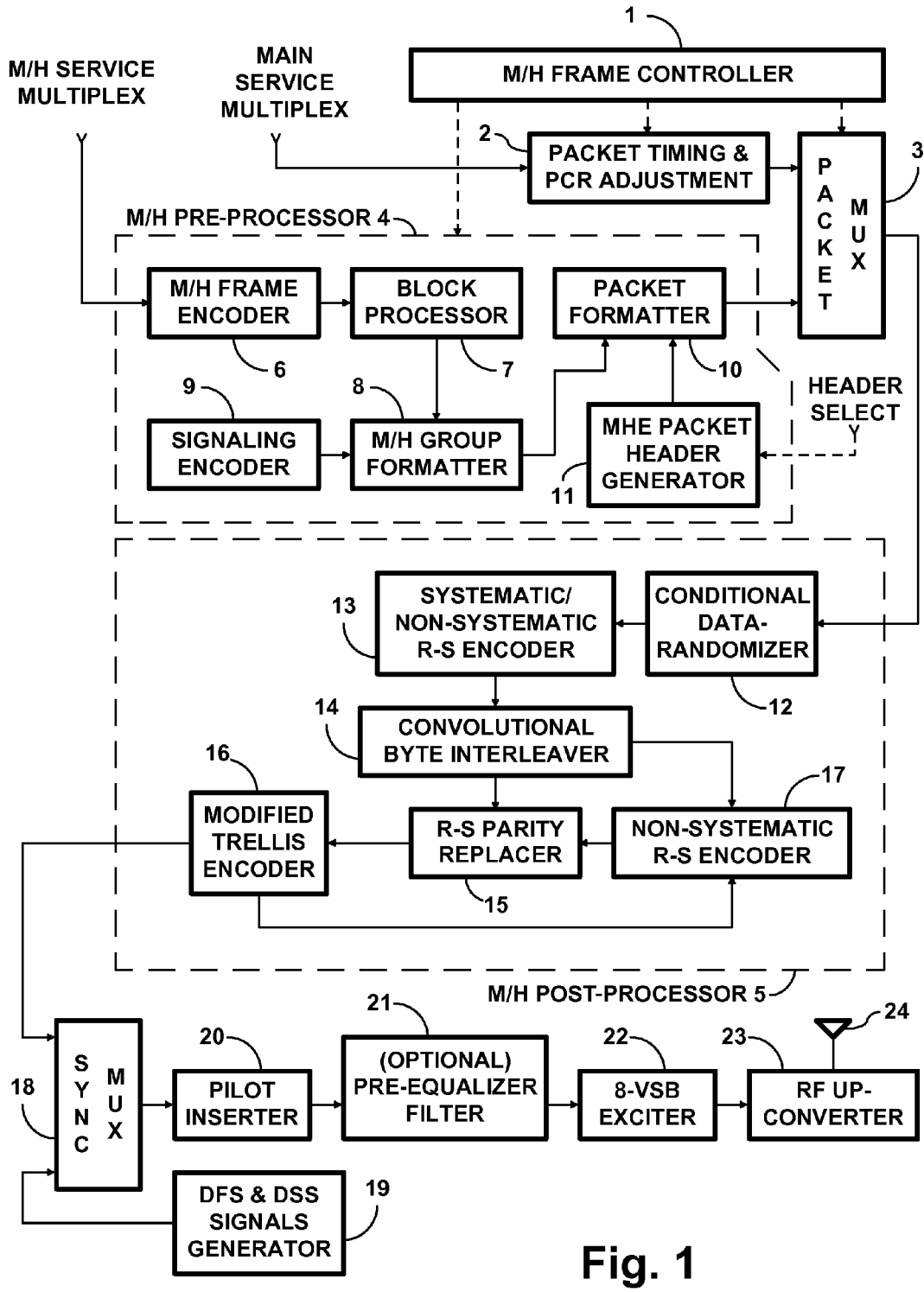
FIG. 1 is a schematic diagram of transmitter apparatus for broadcast digital television (DTV) signals using serially concatenated convolutional coding (SCCC) for M/H service data, which transmitter apparatus in accordance with an aspect of the invention encapsulates M/H service data within (207, 187) R-S FEC codewords the PIDs of which indicate the version of the M/H Standard that governs the transmission of the M/H service data therewithin, according to an exemplary embodiment.

FIG. 1 shows a transmitter apparatus for broadcast DTV signals using SCCC for M/H service data, according to an exemplary embodiment of the present invention. The transmitter apparatus receives two sets of input streams: one comprises MPEG transport stream (TS) packets of ATSC main service data and the other comprises M/H service data. The M/H service data are encapsulated in MPEG TS packets before emission. This avoids reception of the main service data by legacy 8-VSB receivers. The M/H service data can be carried in MPEG TS packets, such as MPEG-2 video/audio or MPEG-4 video/audio, but is conventionally carried by internet-protocol (IP) packets. A primary function of the FIG. 1 transmitter apparatus is to combine these two types of streams into one stream of MPEG TS packets and to process the combined stream for transmission as an ATSC trellis-coded 8 VSB signal.

An M/H frame controller 1 controls these procedures. The main service multiplex stream of data is supplied to a packet timing and program clock reference (PCR) adjustment unit 2 before the packets of that stream are routed to a packet multiplexer 3 to be time-division multiplexed with packets encapsulating the M/H service data. Because of their time-division multiplexing with the packets encapsulating the M/H service data, changes have to be made to the time of emission of the main service stream packets compared to the timing that would occur with no M/H service data present. The packet timing and PCR adjustment unit 2 makes these timing changes responsive to control signals supplied thereto from the M/H frame controller 1. The packet multiplexer 3 time-division multiplexes the main service stream packets with the packets encapsulating the M/H service data, as directed by control signals from the M/H frame controller 1. The operations of the M/H transmission system in regard to the M/H service data are apportioned between two stages: an M/H pre-processor 4 and an M/H post-processor 5.

The function of the pre-processor 4 is to rearrange the M/H service data into an M/H data structure, to enhance robustness of the M/H service data by additional FEC processes, to insert training sequences, and subsequently to encapsulate the processed enhanced data into MHE packets within the ancillary TS. The operations performed by the pre-processor 4 include M/H frame encoding, block processing, M/H Group formatting, packet formatting and M/H signaling encoding. The M/H frame controller 1 provides necessary transmission parameters to the pre-processor 4 and controls the multiplexing of the main service data packets and the M/H-service data packets by the packet multiplexer 3 to assemble each M/H frame.

The function of the post-processor 5 is to process the main service data by normal 8-VSB encoding and to re-arrange the pre-processed M/H service data in the combined stream to ensure backward compatibility with ATSC 8-VSB. The main service data in the combined stream are processed exactly the same way as for normal 8-VSB transmission: randomizing, RS encoding, convolutional byte interleaving and trellis encoding. The M/H service data in the combined stream are processed differently from the main service data, with the pre-processed M/H service data bypassing data randomization. The pre-processed M/H service data is subjected to non-systematic RS encoding which re-arranges their bytes. The non-systematic RS encoding allows insertion of periodically spaced long training sequences without disturbing legacy receivers. Additional operations are done on the pre-processed M/H service data to initialize the trellis encoder memories at the beginning of each training sequence included in the pre-processed M/H service data.

More specifically, the M/H service multiplex stream of data is supplied to the M/H pre-processor 4 for processing and subsequent encapsulation in the payload fields of MPEG null TS packets. The MHE TS packets are supplied to the packet multiplexer 3 after data encapsulation within their payload fields is completed.

Still more specifically, the M/H service multiplex stream of data is supplied to an M/H frame encoder 6 which provides transverse Reed-Solomon (TRS) FEC coding of data packets. The data packets are also subjected to periodic cyclic redundancy check (CRC) coding to locate byte errors for the TRS coding. Each M/H frame is composed of one or two frames of the TRS coding, and the data in each frame of the TRS and CRC coding are randomized independently from one another and from the data of the main service multiplex. The M/H frame encoder 6 is connected for supplying packets of M/H service data and packets of TRS parity bytes within consecutive blocks of the TRS-CRC two-dimensional coding to a block processor 7, as input signal thereto. The block processor 7 includes encoders for each type of single-phase outer convolutional coding used in the SCCC and respective subsequent interleavers for successive 2-bit symbols of each type of single-phase outer convolutional coding.

An M/H Group formatter 8 is connected for receiving the interleaved outer convolutional coding from the block processor 7 as input addressing signal. The M/H Group formatter 8 includes an interleaved M/H Group format organizer that operates on the M/H Group format as it appears after the ATSC data interleaver. It maps the FEC coded M/H service data from the block processor 7 into corresponding M/H blocks of a M/H Group; adds pre-determined training data bytes and data bytes to be used for initializing the trellis encoder memories; and inserts place-holder bytes for main service data, MPEG header and non-systematic RS parity. Also, place-holder bytes for the 3-byte headers of MHE packets are inserted in accordance with an aspect of the invention disclosed herein. The interleaved M/H Group format organizer adds some dummy bytes to complete construction of the intended M/H Group format. The interleaved M/H Group format organizer assembles a M/H Group of 118 consecutive TS packets. Some of these TS packets comprise the interleaved outer convolutional coding supplied by the block processor 7. Others of these TS packets are prescribed training signals stored in a read-only memory (ROM) within the M/H Group formatter 8 and inserted at prescribed intervals within the M/H Group. Still others of these TS packets are generated by a signaling encoder 9.

Transmission of the M/H service data uses two kinds of signaling channels generated by the signaling encoder 9. One is a Transmission Parameter Channel (TPC), and the other is a Fast Information Channel (FIC). The TPC is for signaling M/H transmission parameters such as various FEC modes and M/H frame information. The FIC facilitates the selection of M/H data concerning specific services from greater amounts of M/H data that can be recovered by the earlier stages of an M/H receiver. This selected M/H data concerning specific services is subsequently processed by the later stages of the M/H receiver. The earlier stages of the receiver are apt to be "hardware" within special-purpose integrated circuitry dedicated to the task of recovering M/H data. Many of the later stages of the M/H receiver are apt to be realized in software within a general-purpose microprocessor.

The interleaved M/H Group format organizer is followed in cascade connection by a byte de-interleaver within the M/H Group formatter 8. This byte de-interleaver complements the ATSC convolutional byte interleaver. The M/H Group formatter 8 is connected for supplying a response of this de-interleaver as its output signal, which is applied as input signal to a packet formatter 10. Initially, the packet formatter 10 expunges the main service data place holders and the RS parity place holders that were inserted by the interleaved M/H Group format organizer for proper operation of the byte de-interleaver in the M/H Group formatter 8. According to an exemplary embodiment, the packet formatter 10 subsequently replaces the 3-byte place holders for MHE packet headers with an MHE packet header supplied from an MHE packet header generator 11 and inserts an MPEG TS sync byte before each 187-byte data packet as a prefix thereof. The packet formatter 10 supplies 118 M/H data-encapsulating TS packets per M/H Group to the packet multiplexer 3, which time-division multiplexes the M/H service TS packets and the main service TS packets to construct M/H frames.

In some cases the MHE packet header generator 11 is a read-only memory storing a variety of possible MHE packet headers, the appropriate one of which is selected by a HEADER SELECT signal supplied to the ROM as read address. In other cases the MHE packet header can be hard-wired into the DTV transmitter apparatus. In still other cases the MHE packet header may be assembled from bits supplied from more than one source of control signal.

The M/H frame controller 1 controls the packet multiplexer 3 in the following way when the packet multiplexer schedules the 118 TS packets from the packet formatter 10. Thirty-seven packets immediately precede a data-field synchronization (DFS) segment in a 313-segment VSB field of data, and another eighty-one packets immediately succeed that DFS segment. The packet multiplexer 3 reproduces next-in-line main service TS packets in place of MPEG null packets that contain place-holder bytes for main service data in their payload fields. The packet multiplexer 3 is connected to supply the TS packets it reproduces to the post-processor 5 as input signal thereto.

More specifically, the packet multiplexer 3 is connected to apply the TS packets it reproduces to a conditional data randomizer 12 as the input signal thereto. The conditional data randomizer 12 suppresses the sync bytes of the 188-byte TS packets and randomizes the remaining data in accordance with conventional 8-VSB practice, but only on condition that it is not encapsulated M/H service data. The encapsulated M/H service data bypass data randomization. The other remaining data are randomized per A/53, Annex D, §4.2.2.

A systematic/non-systematic R-S encoder 13 for systematic and non-systematic (207, 187) R-S codes is connected to receive, as its input signal, the 187-byte packets that the conditional data randomizer 12 reproduces with conditional data randomization. The R-S parity generator polynomial and the primitive field generator for the R-S encoder 13 are the same as those A/53, Annex D, FIG. 5 prescribes for (207, 187) R-S coding. When the R-S encoder 13 receives a main service data packet, the R-S encoder 13 performs the systematic R-S coding process prescribed in A/53, Annex D, §4.2.3, appending twenty bytes of R-S parity data to the conclusion of the 187-byte packet. When the R-S encoder 13 receives an M/H service data packet, the RS encoder 13 performs a non-systematic R-S encoding process. Twenty bytes of R-S parity data obtained from the non-systematic RS encoding process are inserted in a prescribed parity byte location within the M/H service data packet.

A convolutional byte interleaver 14 is connected for receiving as its input signal the 207-byte R-S codewords that the R-S encoder 13 generates. The byte interleaver 14 is generally of the type specified in A/53, Annex D, §4.2.4. The byte interleaver 14 is connected for supplying byte-interleaved 207-byte R-S codewords via a R-S parity replacer 15 to a modified trellis encoder 16. The basic trellis encoding operation of the modified trellis encoder 16 is similar to that specified in A/53, Annex D, §4.2.4. The modified trellis encoder 16 converts the byte-unit data from the byte interleaver 14 to symbol units and performs a 12-phase trellis coding process per Section 6.4.1.4 Main Service Trellis Coding of A53-Part-2-2007. In order for the output data of the modified trellis encoder 16 to include pre-defined known training data, initialization of the memories in the modified trellis encoder 16 is required. This initialization is very likely to cause the R-S parity data calculated by the R-S encoder 13 prior to the trellis initialization to be erroneous. The R-S parity data must be replaced to ensure backward compatibility with legacy DTV receivers. Accordingly, the trellis encoder is connected for supplying the changed initialization byte to a non-systematic R-S encoder 17 for non-systematic (207, 187) R-S codes, which encoder 17 re-calculates the R-S parity of the affected M/H packets. The non-systematic R-S encoder 17 is connected for supplying the re-calculated R-S parity bytes to the R-S parity replacer 15, which substitutes the re-calculated R-S parity bytes for the original R-S parity bytes before they can be supplied to the modified trellis encoder 16. That is, the R-S parity replacer 15 reproduces the output of the convolutional byte interleaver 14 as the data bytes for each packet in its output signal, but reproduces the output of the non-systematic R-S encoder 17 as the R-S parity for each packet in its output signal. The R-S parity replacer 15 is connected to supply the resulting packets in its output signal to the modified trellis encoder 16 as the input signal thereto.

A synchronization multiplexer 18 is connected for receiving as the first of its two input signals the ⅔ trellis-coded data generated by the modified trellis encoder 16. The sync multiplexer 18 is connected for receiving its second input signal from a data field sync (DFS) and data segment sync (DSS) signals generator 19 of synchronization signals comprising the DSS and the DFS signals. The DSS and the DFS signals are time-division multiplexed with the ⅔ trellis-coded data per custom in the output signal from the sync multiplexer 18, which is supplied to a pilot inserter 20 as input signal thereto. The pilot inserter 20 introduces a direct component offset into the signal for the purpose of generating a pilot carrier wave during subsequent balanced modulation of a suppressed intermediate-frequency (IF) carrier wave. The output signal from the pilot inserter 20 is a modulating signal, which may be passed through a pre-equalizer filter 21 before being supplied as input signal to an 8-VSB exciter 22 to modulate the suppressed IF carrier wave. The 8-VSB exciter 22 is connected for supplying the suppressed IF carrier wave to a radio-frequency (RF) up-converter 23 to be converted upward in frequency to repose within the broadcast channel. The up-converter 23 also amplifies the power of the RF signal that it applies to the broadcast antenna 24.

The nature of a PID that the MHE packet header generator 11 supplies to the packet formatter 10 is of particular concern with regard to the present invention. According to an exemplary embodiment, the PID is chosen for signaling a version of the M/H Standard in accordance with which the M/H service data are transmitted, but only if the M/H service data will be usefully received by receivers designed for receiving signals transmitted in accordance with that particular version of the M/H Standard. Otherwise, if M/H data are transmitted in accordance with more than one version of the M/H Standard, the portions of the M/H service data common to those versions of the M/H Standard are transmitted in MHE packets having PIDs identifying the earliest version of the M/H Standard that can usefully receive the data.

The potential problem with this arrangement is that a receiver designed for a later version of the M/H Standard may usefully receive only some portions of the robust data transmitted in accordance with an earlier version of the M/H Standard. This problem can be sidestepped by providing a plurality of special PIDs for MHE packets in each version of the M/H Standard. One special PID signals MHE packets that are useful only to transmissions in accordance with that particular version of the standard. This enables a receiver not to reproduce the contents of those MHE packets for application to later stages of the receiver. Another special PID signals MHE packets that are useful only to transmissions in accordance with that particular version of the standard and its immediate successor. The PID of the MHE packet can be thought of as an extension of the PIDs of the packets encapsulated therein.

The table shown in FIG. 2 illustrates how the PIDs in the headers of (207, 187) R-S FEC codewords used to encapsulate the M/H service data can signal versions of the M/H standard in accordance with which those M/H service data are transmitted. The Greek letters in the left column of the table represent different 13-bit PIDs. A DTV receiver is expected to know the versions of the M/H standard used for transmitting DTV signals that the receiver can usefully receive.

Figure 3:
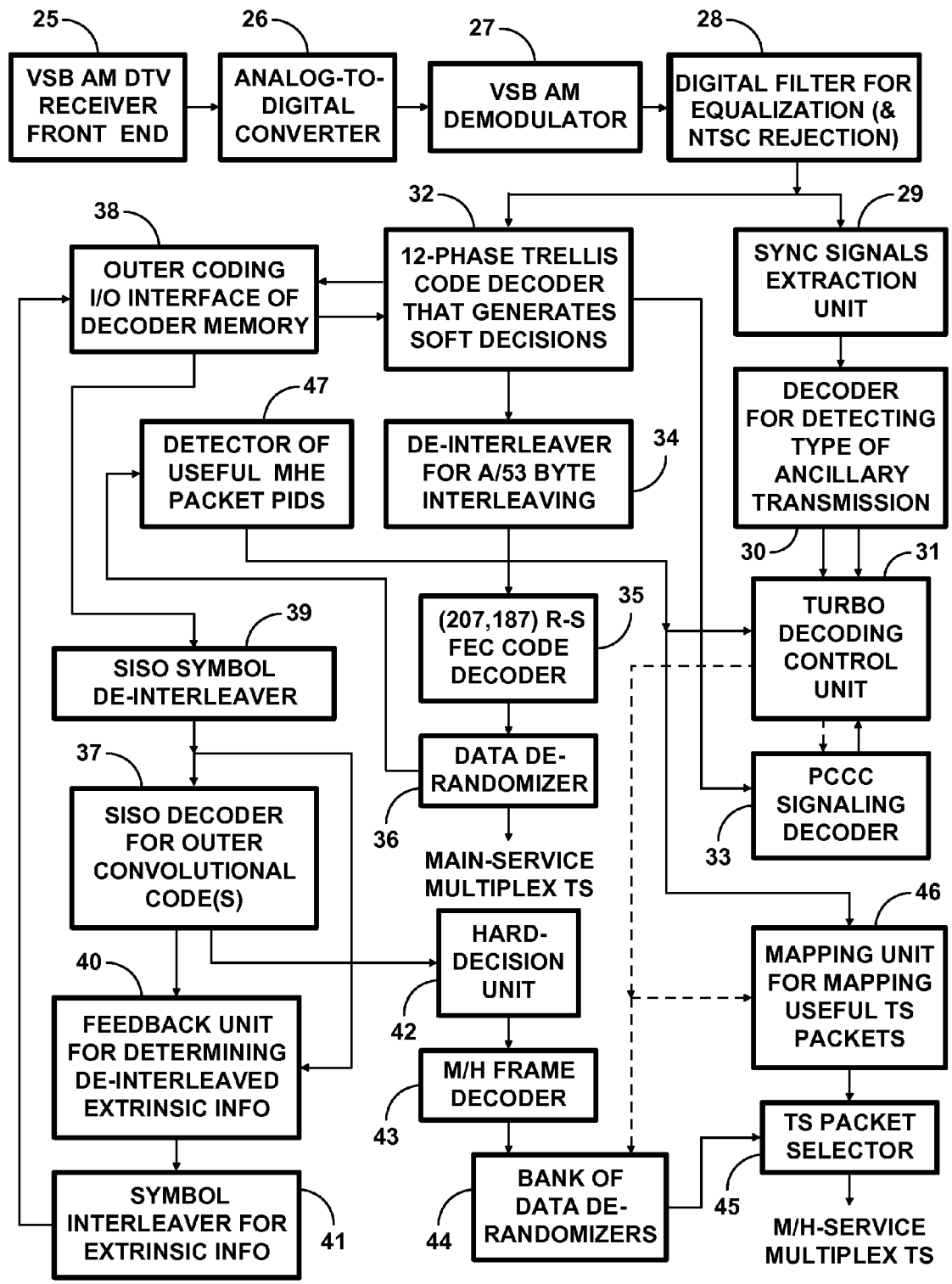
FIG. 3 is a schematic diagram of receiver apparatus for DTV signals transmitted by transmitter apparatus of the sort shown in FIG. 1, according to an exemplary embodiment.

FIG. 3 shows a receiver apparatus for DTV signals transmitted by an M/H transmitter apparatus of the sort shown in FIG. 1, according to an exemplary embodiment. The FIG. 3 DTV receiver apparatus includes a vestigial-sideband amplitude-modulation (VSB AM) DTV receiver front-end 25 for selecting a radio-frequency DTV signal for reception, converting the selected RF DTV signal to an intermediate-frequency DTV signal, and for amplifying the IF DTV signal. An analog-to-digital converter 26 is connected for digitizing the amplified IF DTV signal supplied from the DTV receiver front-end 25. A VSB AM demodulator 27 is connected for demodulating the digitized VSB AM IF DTV signal to generate a digitized baseband DTV signal, which is supplied to a digital filter 28 for equalization of channel response and for rejection of co-channel interfering NTSC signal. A synchronization signals extraction unit 29 is connected for receiving the digital filter 28 response. Responsive to DFS signals, the sync extraction unit 29 detects the beginnings of data frames and fields. Responsive to DSS signals, the sync extraction unit 29 detects the beginnings of data segments. The FIG. 3 DTV receiver apparatus uses the DSS and DFS signals for controlling its operations similarly to the way done in related DTV art. FIG. 3 does not explicitly show the circuitry for effecting these operations.

A decoder 30 for detecting the type of ancillary transmission responds to 8-bit sequences contained in final portions of the reserved portions of DFS signals separated by the sync extraction unit 29. The decoder 30 is connected for indicating the type of ancillary transmission to a turbo decoding control unit 31 that controls turbo decoding in the FIG. 3 DTV receiver apparatus. The type of ancillary transmission that the decoder 30 detects may be one that conditions the decoder 30 to extract further information concerning the ancillary transmission from the initial portions of the reserved portions of DFS signals separated by the sync extraction unit 29. The decoder 30 is connected for supplying such further information to the turbo decoding control unit 31. This further information is apt to include pointers to portions of the data field that contain signaling information describing ancillary transmission in greater detail.

FIG. 3 shows a 12-phase trellis decoder 32 connected for receiving the digital filter 28 response. In actual practice the 12-phase trellis decoder 32 shown in FIG. 3 is apt to be a plurality of component 12-phase trellis decoders, each component 12-phase trellis decoder being capable of decoding the digital filter 28 response. Such construction of the trellis decoder 32 facilitates turbo decoding of various types of SCCC being carried on independently of each other, each using separate temporary storage of data.

FIG. 3 further shows the 12-phase trellis decoder 32 connected for supplying trellis-decoding results to a signaling decoder 33. In actual practice, these trellis-decoding results may be supplied by one of a plurality of component 12-phase trellis decoders in the trellis decoder 32, and the signaling decoder 33 may be connected to feed back extrinsic information to that component trellis decoder to implement turbo decoding. The component 12-phase trellis decoder will include a memory for storing the digital filter 28 response for updating by the extrinsic information. The turbo decoding control unit 31 enables operation of the signaling decoder 33 with respect to those portions of the data field that contain signaling information describing ancillary transmission in greater detail. To keep FIG. 3 from being too cluttered to be understood readily, FIG. 3 does not explicitly show most of the connections of the turbo decoding control unit 31 to the elements involved in decoding the SCCC.

FIG. 3 shows that the 12-phase trellis decoder 32 is further connected for supplying trellis-decoding results to a byte de-interleaver 34 for A/53 byte interleaving. The byte de-interleaver 34 provides byte-by-byte de-interleaving of these results to generate an input signal for a R-S decoder 35 of the de-interleaved (207, 187) R-S FEC codewords supplied from the byte de-interleaver 34. The de-interleaving of the byte de-interleaver 34 complements the convolutional byte interleaving prescribed by A/53, Annex D, §4.2.4. In actual practice, the trellis-decoding results may be supplied to the byte de-interleaver 34 by one of a plurality of component 12-phase trellis decoders in the trellis decoder 32. Preferably, but not necessarily, the de-interleaved (207, 187) R-S FEC codewords are accompanied by soft-decision information, and the R-S decoder 35 is of a sort that can use the soft-decision information to improve overall performance of the decoders 32 and 35. The R-S decoder 35 is connected for supplying packets of randomized hard-decision data to a data de-randomizer 36, which exclusive-ORs the bits of the randomized hard-decision data with appropriate portions of the pseudo random binary sequence (PRBS) prescribed in A/53, Annex D, §4.2.2 to generate a first transport stream. This first transport stream is constituted in part of MPEG-2-compatible packets of de-randomized principal data. Insofar as the R-S decoder 35 is capable, it corrects the hard-decision 187-byte randomized data packets that it supplies to the data de-randomizer 36. The output signal from the data de-randomizer 36 reproduces the main service multiplex transport stream.

FIG. 3 shows that the 12-phase trellis decoder 32 is further connected as a soft-input, soft-output (SISO) inner decoder in a turbo decoding loop that also includes a soft-input, soft-output (SISO) outer decoder 37 for outer convolutional code (s). In actual practice, another of a plurality of component 12-phase trellis decoders in the trellis decoder 32 is connected to function as the SISO inner decoder in this turbo decoding loop, and the SISO outer decoder 37 is connected to feed back extrinsic information to that component trellis decoder to implement turbo decoding. The turbo decoding procedures often involve iterations of both decoding of the inner convolutional code of the SCCC by the 12-phase trellis decoder 32 and decoding of the outer convolutional code of the SCCC by the SISO outer decoder 37. The component 12-phase trellis decoder will include memory for storing the digital filter 28 response for updating by the extrinsic information. The decoding operations of the decoders 32 and 37 are staggered in time. The decoders 32 and 37 may be of types that use the soft-output Viterbi algorithm (SOVA) for evaluating code trellises, but preferably (although not necessarily) are of types that use the logarithmic maximum a posteriori algorithm (log-MAP) for such evaluations. In any case, both of the decoders 32 and 37 comprise respective memory for temporary storage of the soft-decisions that they respectively generate.

An outer coding input/output (I/O) interface 38 is used for accessing selected portions of the memory for temporary storage of soft-decisions in the trellis decoder 32 that contain soft-decisions related to the interleaved outer convolutional coding of the SCCC. This I/O interface 38 includes a memory address generator, the operation of which is controlled by the turbo decoding control unit 31. Responsive to control by the turbo decoding control unit 31, the I/O interface 38 reads soft-decisions related to the reproduced interleaved outer convolutional coding of the SCCC to the input port of a symbol de-interleaver 39.

The symbol de-interleaver 39 is connected for de-interleaving the interleaved outer convolutional coding of the SCCC and supplying soft-decisions related to the de-interleaved outer convolutional coding to the SISO outer decoder 37 and to a feedback unit 40 for determining de-interleaved extrinsic information to be fed back for turbo decoding procedures. The symbol de-interleaver 39 is customarily constructed from a random-access memory (RAM) written with write addressing different from its read addressing when subsequently read. The SISO outer decoder 37 is connected for supplying soft decisions concerning its decoding results to the feedback unit 40 for determining de-interleaved extrinsic information feedback. The RAM in the symbol de-interleaver 39 can be re-read to supply the feedback unit 40 with soft decisions concerning the input signal of the SISO outer decoder 37 contemporaneously with soft decisions concerning the output signal of the SISO outer decoder 37. This eliminates the need for additional temporary memory within the feedback unit 40 for temporally aligning the input and output signals of the SISO outer decoder 37.

The feedback unit 40 for determining de-interleaved extrinsic information to be fed back for turbo decoding procedures supplies that information to an symbol interleaver 41 that interleaves the soft decisions with regard to two-bit symbols of that information to generate extrinsic information. The extrinsic information is fed back through the I/O interface 38 to update the trellis-coded digital filter 28 response that is temporarily stored in selected portions of the memory in the trellis decoder 32 that hold the time-slice that is being turbo decoded.

FIG. 3 shows that the symbol de-interleaver 39 is further connected for supplying de-interleaved soft decisions from the trellis decoder 32 to hard-decision unit 42. FIG. 3 also shows the SISO decoder 37 connected for subsequently supplying its soft decisions to the hard-decision unit 42. The hard-decision unit 42 generates a set of hard decisions in response to each set of soft decisions supplied thereto. The hard-decision unit 42 is connected to supply the resulting hard decisions as to the randomized data to an M/H frame decoder 43 as input signal thereto. The M/H frame decoder 43 is connected for supplying its output signal to a bank 44 of data de-randomizers as their input signals. The turbo decoding control unit 31 is connected for supplying a control signal that selects the response of one of the bank 44 of data de-randomizers that is suitable for reproducing the M/H service multiplex transport stream.

The FIG. 3 receiver apparatus differs from related art receiver apparatuses in the following respects. A TS packet selector 45 is connected for receiving, as a TS input signal thereof, a selected response of the bank 44 of data de-randomizers. A mapping unit 46 for mapping useful TS packets is connected for supplying a control signal to the TS packet selector 45 that conditions it to reproduce only those TS packets of the M/H service multiplex that can be utilized by the subsequent stages of the receiver. The mapping unit 46 for mapping useful TS packets contains a memory for temporary storage of maps corresponding to the R-S frames in temporary storage in the memory within the M/H frame decoder 43. A detector 47 for detecting non-useful PIDs is connected for receiving header information concerning 8-VSB packets from the data de-randomizer 36. The PIDs that the detector 47 considers non-useful are those used in versions of the M/H Standard that the FIG. 3 receiver apparatus is not designed to receive. The detector 47 is connected to supply indications that it has detected PIDs that it considers non-useful, which indications are applied as input signal to the mapping unit 46 for mapping useful TS packets. Those portions of the TS packet map that would be filled with data not useful to the FIG. 3 receiver are conditioned for supplying the TS packet selector 45 with control signal that conditions the selector 45 not to reproduce the TS packets from the bank 44 of data de-randomizers.

Figure 4:
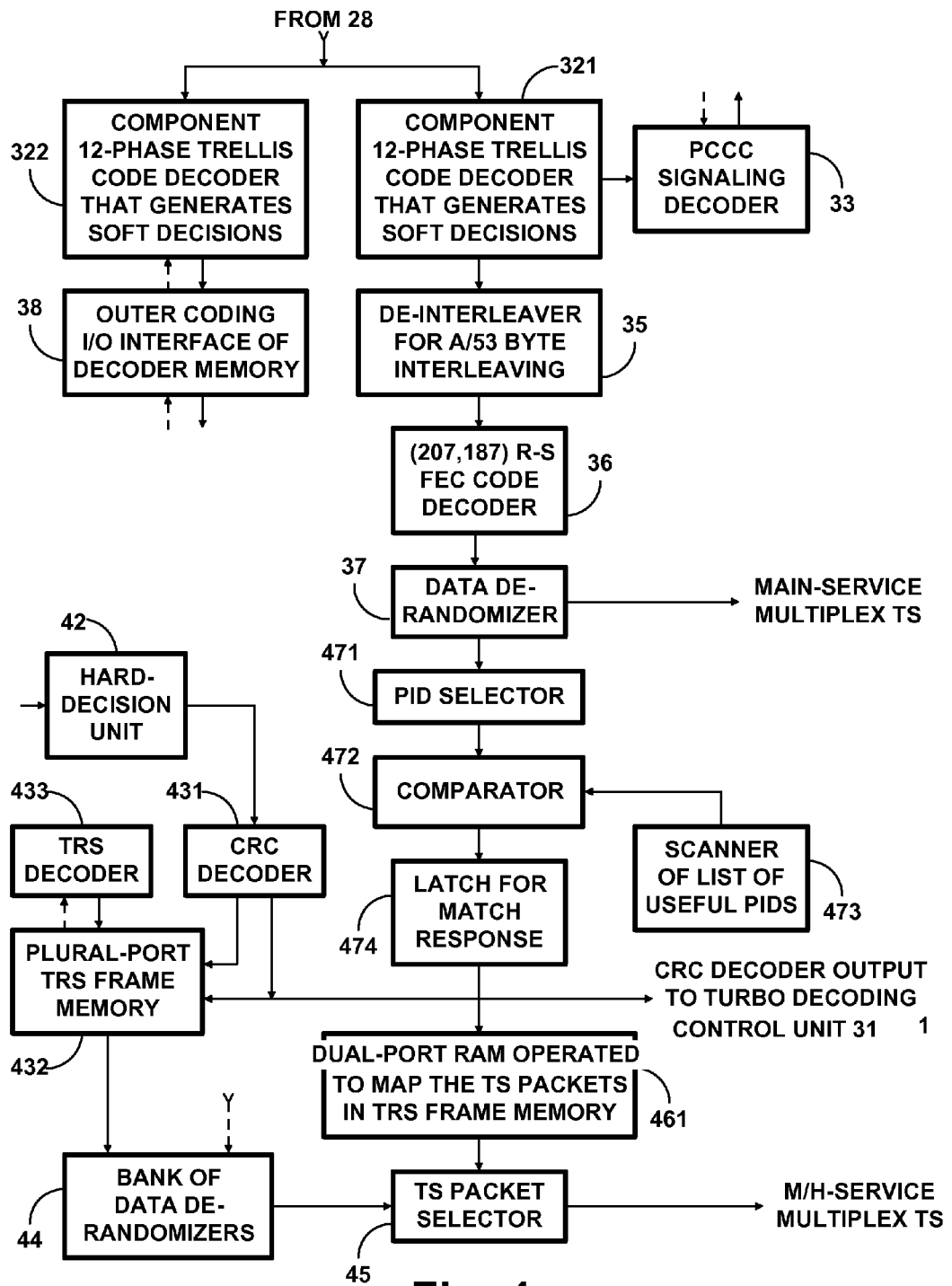
FIG. 4 is a more detailed schematic diagram of portions of one embodiment of the FIG. 3 receiver apparatus, according to an exemplary embodiment.

FIG. 4 shows details of portions of the FIG. 3 receiver apparatus, according to an exemplary embodiment. FIG. 4 shows the 12-phase trellis decoder 32 more specifically as comprising component 12-phase trellis decoders 321 and 322. FIG. 4 shows the M/H frame decoder 43 more specifically as comprising a decoder 431 for 2-byte CRC codes, a plural-port TRS frame memory 432, and a decoder 432 for a selected one of the possible TRS codes. The hard-decision unit 42 is connected for supplying hard decisions to the decoder 431 for CRC codewords. The decoder 431 reproduces the hard decisions that the decoder 431 determines to be the initial portions of valid CRC codewords. The decoder 431 also generates an indication concerning the probable validity of each CRC codeword, which indication is forwarded to the turbo decoding control unit 31. In some designs the turbo decoding control unit 31 may discontinue iterations of the turbo decoding procedures responsive to indication that a CRC codeword is probably valid. The decoder 431 is connected for writing the initial portions of CRC codewords into a TRS frame memory 432 together with the indications of the probable validity of each of those codewords. The indications of the probable validity of each of those codewords can be used for locating byte errors during TRS decoding procedures. When the TRS frame memory 432 has been loaded with a TRS frame and the error-location information, its contents are supplied column of bytes by column of bytes to the TRS decoder 432 for a selected one of the possible TRS codes. After correcting as many byte errors as possible in each column of bytes, the TRS decoder 432 returns the column of bytes to its original location within the TRS frame memory 432. After all the columns of bytes have been corrected insofar as possible and returned to their original locations within the TRS frame memory 432, the contents of selected slots in the TRS frame memory are read row of bytes after row of bytes to supply input signals to one or more data randomizers in the bank 44 of data randomizers.

FIG. 4 shows a non-useful PIDs detector that comprises a PID selector 471, a comparator 472, a scanner 473 for scanning a list of PIDs that the receiver will be capable of usefully receiving, and a latch 474 for any match output signal from the comparator 472. More specifically, the PID selector 471 is connected to a first input port of the comparator 472 for selecting a respective 13-bit PID from each data packet of the main service multiplex TS supplied as a response from the data de-randomizer 36. The scanner 473 is connected for scanning a list of PIDs that the receiver will be capable of usefully receiving to a second input port of the comparator 472. The comparator 472 compares those PIDs with the PID selected to its first input port well before the PID selector 471 selects the next PID. The comparator 472 supplies a response "ONE" when and only when one of the PIDs scanned to its second input port matches the PID selected to its first input port. Otherwise, the comparator 472 supplies a response "ZERO". The comparator 472 is connected for supplying its response to a latch 474 for any match output signal from the comparator 472. More particularly, the latch 474 can be a set-reset flip-flop, set by the response "ONE" from the comparator 472 and reset by a response "ONE" generated during the DSS interval. The true output of the set-reset flip-flop latches any indication that the PID selected by the PID selector 471 is a useful one.

FIG. 4 shows a dual-port RAM 461 that is a principal component of the mapping unit 46 for mapping useful TS packets. FIG. 4 shows that the RAM 461 is connected for having the latch 474 response for each PID selected by the PID selector 471 written to a suitable map location. FIG. 4 does not explicitly show a write address generator for supplying write addresses to the RAM 461 nor a read address generator for supplying read addresses to the RAM 461. The read addresses skip certain locations in the RAM 461 to take into account (a) that the code rate for ancillary data is an aliquot fraction of 8-VSB code rate and (b) that the ancillary data does not pack into an integral number of MHE packets. The read address generator is connected for supplying the TS packet selector 45 indications of whether each TS packet supplied to it is useful to the receiver. The read address generator supplies these indications at a rate that takes into account the variable processing times associated with successful turbo decoding procedures. Responsive to such indications, the TS packet selector 45 marks each of the TS packets it reproduces as being either useful or non-useful to the receiver.

The configuration shown in FIG. 4 is built on an assumption that the variable processing time associated with successful turbo decoding procedures is always longer than the latent delay through the byte de-interleaver 34, the R-S decoder 35, the data de-randomizer 36, and the succeeding elements used in writing a packet map into the RAM 461. This may not always be the case if the latent delay of the symbol de-interleaver used in turbo coding is short. In such case, the response of the digital filter 28 can be delayed by a digital delay line before application to the component 12-phase trellis decoder 321, or the M/H data can be delayed before reaching the TS packet selector 45.

An alternative strategy for recovering the PIDs of MHE packets is to extract the randomized PIDs from the memory in the byte de-interleaver 34 and de-randomizing them without waiting for R-S decoding and data de-randomization procedures being performed by the R-S decoder 35 and the data de-randomizer 36. The drawback of this alternative strategy is that there is no chance of a byte error in a PID being corrected by R-S decoding.

The FIG. 5 table illustrates how the PIDs in the headers of (207, 187) R-S FEC codewords used to encapsulate the M/H data can signal more than just the versions of the M/H Standard in accordance with which those M/H data are transmitted, according to an exemplary embodiment. The conjecture implicit in the table is that eventually there will have been eight successive versions 1.0, 2.0, 3.0, 4.0, 5.0, 6.0, 7.0 and 8.0 of the ATSC Digital Broadcast Standard for M/H Receivers. These eight successive versions are presumed to offer, at least for a time, backward compatibility for receivers designed for earlier versions of the standard. The FIG. 5 table illustrates that the PIDs in the headers of (207, 187) R-S FEC codewords used to encapsulate the M/H data can signal both the code rate of the ancillary transmissions and the specific use for the ancillary transmissions. A DTV receiver of M/H signals can use the code rate information to help in the control of turbo decoding procedures. The information concerning the ancillary transmissions including parallel concatenated convolutional code (PCCC) signaling information can be used for directing the PCCC signaling information to a decoder therefor. Some of the information concerning the specific use for the ancillary transmissions can be used to help control of procedures to combine advanced video coding (AVC) and scalable video coding (SVC) data. Other of the information concerning the specific use for the ancillary transmissions can be used to help control of procedures for receiving staggercast data.

Audio data are presumed to be encapsulated in the same MHE packets as AVC video data of similar code rate. AVC and SVC video data transmitted with 2:1 reduction in code rate and parenthetically indicated to be repeat data are the re-transmitted data used for staggercasting that combines earlier and later transmissions of the same M/H data in the physical layer. The repeat transmissions preferably use symbol interleaving of the outer convolutional coding that is different from that used in the original transmissions.

What is claimed is:

1. An apparatus for transmitting digital data in an 8-level vestigial sideband (8-VSB) signal form for reception by a mobile/handheld (M/H) receiver, the apparatus comprising:
   an M/H encapsulating (MHE) packet generator that generates MHE packets; and
   a packet formatter that inserts the headers of the MHE packets, comprising additional information about at least part of digital data, into the digital data,
   wherein the at least part of the digital data comprises M/H data coded for transmission in robust form for reception by the M/H receiver, the coded M/H data being encapsulated in the MHE packets that are compliant with an audio/video compression standard,
   wherein the coded M/H data is pre-processed using forward-error-correction coding and at least one of convolutional coding and interleaving before the headers of the MHE packets are inserted into the digital data, and
   wherein the MHE packets comprising the additional information in the headers thereof are post-processed using Reed-Solomon coding, convolutional byte interleaving, and trellis coding.

2. The apparatus of claim 1, wherein, within at least some of the headers of the MHE packets, additional information about the coded M/H data is incorporated, and
   wherein the additional information comprises at least information on a version of an M/H broadcast standard used for the transmission of the digital data in the 8-VSB signal form.

3. The apparatus of claim 1, wherein, within at least some of the headers of the MHE packets, additional information about the coded M/H data is incorporated, and,
   wherein the additional information comprises at least one of:
   information in regard to a version of an M/H broadcast standard used for the transmission of the digital data in the 8-VSB signal form;
   information in regard to a code rate of the transmission of the digital data in the 8-VSB signal form; and
   information in regard to use of the digital data.

4. The apparatus of claim 1, wherein, within at least some of the headers of the MHE packets, additional information about the coded M/H data is incorporated, and
   wherein the respective header of each of the MHE packets comprises a respective packet identifier (PID) that includes at least a part of the additional information.

5. The apparatus of claim 4, wherein respective amounts of the M/H data are accompanied by a sequence of training signals and by header information, corresponding to the PID, in a form of a sequence of Transmission Parameter Channel signaling and a sequence of Fast Information Channel signaling.

6. The apparatus of claim 5, wherein the PID provides information on a version of an M/H broadcast standard used for the transmission of the digital data in the 8-VSB signal form.

7. An apparatus for receiving digital data in an 8-level vestigial sideband (8-VSB) signal form transmitted for reception by a mobile/handheld (M/H) receiver, the apparatus comprising:
   a receiving unit that receives the digital data;
   a detector that detects additional information about at least part of the digital data, the additional information being contained in header portions of M/H encapsulating (MHE) packets included within the digital data; and
   a packet selector that uses the additional information in reproducing the at least part of the digital data,
   wherein the at least part of the digital data comprises M/H data coded for transmission in robust form for reception by the M/H receiver, the coded M/H data being encapsulated in the MHE packets that are compliant with an audio/video compression standard,
   wherein the MHE packets comprise coded M/H data which is pre-processed using forward-error-correction coding and at least one of convolutional coding and interleaving before the headers of the MHE packets are inserted into the digital data, and
   wherein the MHE packets comprising the additional information in the headers thereof are post-processed using Reed-Solomon coding, convolutional byte interleaving, and trellis coding.

8. The apparatus of claim 7, wherein the additional information comprises at least information in regard to a version of an M/H broadcast standard used for the transmitting the digital data in the 8-VSB signal form, and
   wherein the apparatus responds to the information in regard to the version of the M/H broadcast standard for determining whether the apparatus is capable of receiving the at least part of the digital data.

9. The apparatus of claim 7, wherein the additional information comprises at least one of:
   information in regard to a version of an M/H broadcast standard used for the transmission of the digital data in the 8-VSB signal form,
   information in regard to a code rate of the transmission of the digital data in the 8-VSB signal form, and
   information in regard to use of the digital data; and
   wherein the apparatus further comprises a system for modifying its operation in response to the additional information.

10. The apparatus of claim 7, wherein the respective header portion of each of the MHE packets comprises a packet identifier (PID) included as at least a part of the additional information; and wherein the apparatus further comprises a system for modifying its operation in response to the additional information.

11. An apparatus for transmitting digital data in an 8-level vestigial sideband (8-VSB) signal format, wherein at least some of the digital data segments comprise mobile/handheld (M/H) data coded for transmission in robust form for reception by an M/H receiver, the coded M/H data being encapsulated in M/H encapsulating (MHE) packets compliant with an audio/video compression standard, the apparatus comprising:

an M/H Frame encoder connected for organizing M/H data within M/H Frames and forward-error-correction coding the M/H data within each M/H Frame to generate an M/H Frame encoder response;

a block processor connected for further coding the M/H Frame encoder response to generate the coded M/H data to be encapsulated in the MHE packets;

an M/H Group formatter that generates M/H Groups, each M/H Group comprising a respective set of successive data segments each of which incorporates a respective as yet incomplete MHE packet having placeholder bytes in a header region thereof, each of the as yet incomplete MHE packets having a respective extended payload region containing a portion of the coded M/H data generated by the block processor intermixed with further placeholder bytes;

a packet formatter connected for receiving the successive data segments in each of the M/H Groups generated by the M/H Group formatter and introducing respective modifications into each of the successive data segments, the modifications including installation of a respective one of headers of the MHE packets into the header region of one of the as yet incomplete MHE packets generated by the M/H Group formatter, replacing the placeholder bytes therein; and an M/H post-processor connected for further processing the successive data segments as modified by the packet formatter, the further processing including Reed-Solomon coding of the successive data segments as modified by the packet formatter, inclusion of results from the Reed-Solomon coding in a convolutional byte interleaving procedure, and modified trellis coding of results from the convolutional byte interleaving procedure.

12. The apparatus of claim 11, wherein the headers of the MHE packets in each M/H Group each comprise a packet identifier (PID) indicative of the kind of coded M/H data encapsulated in the MHE packets of that M/H Group.

13. The apparatus of claim 11, wherein, within at least some of the headers of the MHE packets, additional information about the coded M/H data is incorporated, and wherein the additional information comprises information regarding which version of an M/H broadcast standard is used for the transmission of the digital data in the 8-VSB signal form.

14. An apparatus for receiving digital data in an 8-level vestigial sideband (8-VSB) signal form transmitted in robust form for reception by a mobile/handheld (M/H) receiver, the apparatus comprising:

a receiving unit that receives the digital data;

a detector that detects additional information about at least part of the digital data which additional information is contained in header portions of M/H encapsulating (MHE) packets, the header portions being inserted in the digital data; and a packet selector that uses the additional information in selectively reproducing the at least part of the digital data, wherein the at least part of the digital data comprises M/H data that was coded for transmission in robust form and encapsulated in the MHE packets, wherein locations of the header portions in the MHE packets are different from locations of frame syncs and segment syncs of the digital data.

15. The apparatus of claim 1, wherein the header of each of the MHE packets comprises a respective packet identifier (PID) that differs from a PID prescribed for identifying null packets and that indicates some of the coded M/H data are encapsulated within that particular MHE packet.

16. The apparatus of claim 15, wherein the PID within the header of each of the MHE packets indicates what particular kind of coded M/H data is encapsulated in that particular MHE packet.

17. The apparatus of claim 11, wherein the headers of the MHE packets in each M/H Group each comprise a respective packet identifier (PID) that differs from the PID used to identify null packets and that indicates some of the coded M/H data are encapsulated within that particular MHE packet.

18. The apparatus of claim 17, wherein the PID within the header of each of the MHE packets indicates what particular kind of coded M/H data is encapsulated in that particular MHE packet.

19. The apparatus of claim 1, wherein the M/H data is generated for reception by the M/H receiver separately from main service data corresponding to the M/H data.

20. The apparatus of claim 7, wherein the M/H data is generated for reception by the M/H receiver separately from main service data corresponding to the M/H data.

21. The apparatus of claim 14, wherein the M/H data is generated for reception by the M/H receiver separately from main service data corresponding to the M/H data.

* * * * *